United States Patent [19]
Miyoshi

[11] Patent Number: 6,090,436
[45] Date of Patent: Jul. 18, 2000

[54] GOLD PASTE FOR A CERAMIC CIRCUIT BOARD

[75] Inventor: Akihiko Miyoshi, Osaka, Japan

[73] Assignee: Matsushita Electric Industrial Co., Ltd., Osaka, Japan

[21] Appl. No.: 08/888,916

[22] Filed: Jul. 7, 1997

Related U.S. Application Data

[62] Division of application No. 08/386,813, Feb. 10, 1995, Pat. No. 5,714,241, which is a division of application No. 08/194,423, Feb. 10, 1994, Pat. No. 5,429,670.

[30] Foreign Application Priority Data

Apr. 26, 1993 [JP] Japan ................................. 5-099440

[51] Int. Cl.[7] .................................................. B05D 5/12
[52] U.S. Cl. .......................... 427/96; 427/125; 427/376.6; 427/376.7; 427/419.1
[58] Field of Search .......................... 427/96, 125, 376.6, 427/376.7, 419.1

[56] References Cited

U.S. PATENT DOCUMENTS

| | | | |
|---|---|---|---|
| 2,525,209 | 10/1950 | Davis | 15/203 |
| 3,021,233 | 2/1962 | Fenity | 117/227 |
| 3,440,182 | 4/1969 | Hoffman | 252/514 |
| 3,480,566 | 11/1969 | Hoffman | 252/514 |
| 3,516,949 | 6/1970 | Hoffman | 252/514 |
| 3,960,777 | 6/1976 | Coyle | 252/514 |
| 3,969,570 | 7/1976 | Smith | 428/336 |
| 4,004,057 | 1/1977 | Hoffman | 428/209 |
| 4,795,670 | 1/1989 | Nishigaki et al. | 428/209 |
| 5,066,620 | 11/1991 | Sunahara | 501/21 |

FOREIGN PATENT DOCUMENTS

| | | | |
|---|---|---|---|
| 2525209 | 10/1983 | France | C04B 41/14 |
| 63-102103 | 5/1988 | Japan | H01B 1/16 |
| 63-250355 | 4/1990 | Japan | C07C 265/14 |

*Primary Examiner*—Benjamin Utech
*Attorney, Agent, or Firm*—McDermott, Will & Emery

[57] ABSTRACT

An improved gold paste for use in the manufacture of ceramic circuit boards is disclosed, which has a composition comprising an inorganic component, an organic binder, a solvent. The inorganic component contains (a) 84–94 wt % powdery gold with a particle size of 0.3–0.7 μm, (b) 0.3–2.0 wt % powdery $V_2O_5$ with a particle size of 0.3–2.0 μm, and (c) 0.3–2.0 wt % powdery CuO with a particle size of 0.3–2.0 μm.

1 Claim, 2 Drawing Sheets

GOLD PASTE FOR A CERAMIC CIRCUIT BOARD

This is a Divisional of U.S. patent application Ser. No. 08/386,813, filed Feb. 10, 1995, now U.S. Pat. No. 5,714,241 which is a divisional of U.S. patent application Ser. No. 08/194,423, filed Feb. 10, 1994 now U.S. Pat. No. 5,429,670.

This invention generally relates to a ceramic circuit board used to carry thereon such components as semiconductor integrated circuits (ICs) and chip components for establishing interconnection among them. The present invention more particularly pertains to a gold paste for use in the manufacture of ceramic circuit boards, to a ceramic circuit board which is formed using a gold paste of the invention, and to a manufacturing method thereof.

BACKGROUND OF THE INVENTION

The ceramic circuit board has lately attracted considerable attention because of its easiness of multi-layer interconnection and for its thermal expansion coefficient close to that of silicon of IC chips and because inner via conductors can be formed. These features of the ceramic circuit board contribute to increasing the packaging density of, for example, semiconductor ICs. Therefore, the ceramic circuit board now finds many applications in, for example, camera-built-in video systems with smaller circuits.

FIG. 3 cross-sectionally shows a ceramic circuit board which is formed using a conventional gold paste.

An IC bare chip is mounted by a well-known mounting technique called COB (Chip-On-Board) on a surface of the ceramic circuit board of FIG. 3. In COB, IC bare chips are directly mounted on ceramic circuit boards. With the continuing miniaturization of electronic circuit components, this COB mounting technique plays an important role. The COB mounting technique is suitable for multi-layer interconnection.

FIG. 3 shows a conventional ceramic circuit board using a usual gold paste as gold wiring material. This prior art board comprises a ceramic board 11, an IC bare chip 15, gold wiring 17, a gold wire 19, and a silver paste 20. The gold wiring 17, formed by subjecting a usual gold paste to a firing process in the air at temperatures of 800° C. to 900° C., is electrically connected by the gold wire 19 to the IC bare chip 15 that is mounted on the ceramic board 11 through the silver paste 20.

FIG. 4 shows another conventional ceramic circuit board using a usual gold paste as gold wiring material. In the ceramic circuit board of FIG. 4, face-down bonding technique is employed, which needs less area for connecting the IC bare chip 15 and the gold wiring 17 compared to a technique used in the ceramic circuit board of FIG. 4 so that a higher packaging density can be accomplished. FIG. 4 shows a gold bump 16 and a joint layer 21. The IC bare chip 15 carrying thereon the gold bump 16 having a diameter of about 0.2 mm is formed on the gold wiring 17 obtained by sintering a usual gold paste in the air at 800–900° C. so as to establish connection between the gold bump 16 and the gold wiring 17 through the joint layer 21. The joint layer 21 may be an electroconductive adhesive, an anisotropic electroconductivity film/adhesive, a solder, or the similar material. This mounting technique, compared to a face-down bonding technique in which a solder bump is used, is able to provide improved circuit boards having a higher reliability against, for example, heat shock.

The above-described techniques, in which the IC bare chip 15 is mounted on the gold wiring 17 by the gold wire 19 or the gold bump 16, have been regarded as a most reliable IC bare chip mounting technique so far, since gold can stand chemical changes such as oxidization.

Every circuit wiring must be formed thin to meet the high-density requirement. Copper is attractive as a wiring material because of its low resistivity and less migration tendency, and use of copper contributes to speeding up the transfer of signals.

Depicted in FIG. 1 is an improved ceramic circuit board that is fabricated using advantages of both of gold wiring and copper wiring. More specifically, gold is used at a connecting part between an IC bare chip and a ceramic board, while on the other hand copper is used for other interconnections.

FIG. 1 shows surface-layer copper wiring 12, a solder layer 13, a chip component 14, a copper/gold overlap layer 18, a copper via conductor 22, and inner-layer copper wiring 23.

The wiring of the ceramic circuit board of FIG. 1 may be formed as follows. The surface-layer copper wiring 12, the copper via conductor 22, and the inner-layer copper wiring 23 are formed on the ceramic board 11. A gold paste is transferred onto an electrode on the ceramic board 11 where the IC bare chip 15 is placed. Following a drying process, the gold paste thus transferred undergoes a binder burn-out process (removal of a binder) and a firing process in a belt furnace in a nitrogen atmosphere. As a result, the gold wiring 17 and the copper/gold overlap layer 18 are formed. The reason for firing the gold paste in a nitrogen atmosphere is to protect the surface-layer copper wiring 12, the copper via conductor 22, and the inner-layer copper wiring 23 from oxidization.

Usual gold pastes for ceramic circuit boards are suitable when fired in the air. However, when a usual gold paste is fired together with the surface-layer copper wiring 12, the copper via conductor 22, and the inner-layer copper wiring 23, this causes the copper of each wiring to oxidize, therefore dramatically increasing the wiring resistance. As a result, the surface-layer copper wiring 12, the copper via conductor 22, and the inner-layer copper wiring 23 become unworkable.

A solution to the above-described problem may be obtained by firing a gold paste in an atmosphere of nitrogen; however, the obtained gold wiring comes to have not only a higher resistivity but also a weaker adhesion strength to a ceramic board, as compared to one obtained by firing carried out in the air. Particularly, the decrease in gold wiring-to-ceramic board adhesion strength is a serious problem.

Another type of gold paste has been tried, which contains, as its organic binder, only a resin capable of decomposing and vaporing in an atmosphere of nitrogen (e.g., polymethyl acrylate). Such a gold paste was fired in a nitrogen atmosphere, and the resulting gold wiring had been found to fail to improve the adhesion strength to the ceramic board.

A different approach may be tried. In other words, the surface-layer copper wiring 12 is formed after a usual gold paste has been fired in the air to form gold wiring. This approach, however, is applicable only to the manufacture of ceramic circuit boards having neither the copper via conductor 22 nor the inner-surface copper wiring 23.

Another approach may be tried. In this approach, the IC bare chip 15 is connected to the surface-layer copper wiring 12 which is gold-plated. This approach, however, is expensive and causes to the surface-layer copper wiring 12 a problem of how to resist such plating.

SUMMARY OF THE INVENTION

Bearing in mind the foregoing problems accompanied with the prior art techniques, the present invention was made. Therefore, the present invention attempts to provide an improved gold paste for use as a gold wiring material in the manufacture of ceramic circuit boards. The gold paste disclosed by the invention is capable of being subjected to a binder burn-out process as well as to a firing process in a nitrogen atmosphere to form the gold wiring so that the obtained gold wiring can have a relatively strong adhesion strength to a ceramic board. Also, the present invention pertains to a ceramic circuit board which is formed using a gold paste of the invention, and to a manufacturing method thereof.

A concept of the present invention resides in the following discovery. If a predetermined amount of $V_2O_5$ is present in an inorganic component forming a gold paste, this makes the adhesion strength between a ceramic board and gold wiring obtained by firing a gold paste in a nitrogen atmosphere equal to the adhesion strength between a ceramic board and gold wiring obtained by firing a conventional gold paste in the air. If the inorganic component further contains a predetermined amount of CuO, this further strengthens the ceramic board-to-gold wiring adhesion strength, without causing any increase in the resistance of the entire wiring.

The present invention discloses a first gold paste for use as a gold wiring material in the manufacture of ceramic circuit boards. The first gold paste has a composition comprising (a) an inorganic component, (b) an organic binder, and (c) a solvent, wherein the inorganic component contains powdery gold and $V_2O_5$, the powdery gold being present in an amount within the range of 82 to 94 percent by weight in relation to the first gold paste and the $V_2O_5$ being present in an amount within the range of 0.5 to 2.5 percent by weight in relation to the first gold paste.

The present invention discloses a second gold paste for use as a gold wiring material in the manufacture of ceramic circuit boards. The second gold paste has a composition comprising: (a) an inorganic component, (b) an organic binder, and (c) a solvent, in which the inorganic component contains powdery gold and a glass frit that has a content of $V_2O_5$, the powdery gold being present in an amount within the range of 82 to 94 percent by weight in relation to the gold paste, the glass frit being present in an amount within the range of 0.3 to 3.0 percent by weight of the gold paste, and the $V_2O_5$ being present in an amount within the range of 2.0 to 20.0 percent by weight in relation to the glass frit.

In accordance with the first and second gold pastes, powdery gold and $V_2O_5$ are present in predetermined amounts so that the gold wiring obtained by a firing process in a nitrogen atmosphere comes to have a relatively strong adhesion strength to the ceramic board and the same properties as ones obtained by firing a conventional gold paste in the air. Therefore, the gold wiring can be formed, without reducing the solderability of surface-layer copper wiring formed on a ceramic board, increasing the resistance of the surface-layer copper wiring, and increasing the resistances of the copper via conductor and the inner-surface copper wiring formed on the ceramic board at the time when firing a gold paste.

In accordance with the first and the second gold paste, a ceramic circuit board can be realized in which interconnection between a ceramic board and an electronic component (for example, an IC bare chip) is established by gold wiring, while the other interconnections are established by copper wiring.

It is preferable that, in the first and second gold pastes, the inorganic component further contains copper (II) oxide (CuO), the CuO being present in an amount within the range of 0.3 to 2.0 percent by weight in relation to the gold paste. As a result of such an arrangement, the ceramic board-to-gold wiring adhesion strength can be further improved without involving a considerable increase in the resistance of the gold wiring.

It is preferable that the particle size of the CuO of the inorganic component ranges from 0.3 μm to 2.0 μm. This ensures that the process of binder burn-out can be carried out sufficiently. Additionally, the drop in the printability of the gold paste and the drop in the ceramic board-to-gold wiring adhesion strength can be avoided.

It is preferable that, in the first gold paste and the second gold paste, the particle size of the powdery gold ranges from 0.3 μm to 1.5 μm. This ensures that the process of binder burn-out can be carried out sufficiently. Furthermore, the drop in the printability of the gold paste and the drop in the density of the obtained gold wiring can be avoided.

It is preferable that, in the first gold paste, the particle size of the $V_2O_5$ of the inorganic component ranges from 0.3 μm to 2.0 μm. It is preferable that, in the second gold paste, the particle size of the glass frit of the inorganic component ranges from 0.3 μm to 2.0 μm. This prevents the printability of the gold paste and the board-to-wiring adhesion strength from decreasing.

The present invention discloses a third gold paste for use as a gold wiring material in the manufacture of ceramic circuit boards. This third gold paste has a composition comprising: (a) an inorganic component, (b) an organic binder, and (c) a solvent, in which the inorganic component contains powdery gold with average particle size of 0.3 to 0.7 μm, $V_2O_5$, and copper (II) oxide (CuO), the powdery gold being present in an amount within the range of 82 to 94 percent by weight in relation to the gold paste, the $V_2O_5$ being present in an amount within the range of 0.3 to 2.0 percent by weight in relation to the gold paste, and the CuO being present in an amount within the range of 0.3 to 2.0 percent by weight in relation to the gold paste.

The same effects as obtained by the first and second gold pastes can be expected by the third gold paste. In addition, with the third gold paste, the process of firing can be carried out at firing temperatures from 580° C. up to 750° C. in a nitrogen atmosphere. The particle size of the powdery gold is here limited to within the range of from 0.3 μm to 0.7 μm, so that even if the firing temperature is 580–750° C., both of the removal of a binder from the gold paste and the sintering of the powdery gold can be done sufficiently.

In accordance with the third gold paste, gold wiring can be mounted directly on the copper via conductor, not through the surface-layer copper wiring. Further, direct connection of surface-layer copper wiring to gold wiring can be established, not through a copper/gold overlap section. Therefore, the mounting can be done at a higher-density.

It is preferable that, also in the third gold paste, the particle size of the $V_2O_5$ of the inorganic component ranges from 0.3 μm to 2.0 μm. As a result, not only the drop in the printability of the gold paste but also the drop in the ceramic board-to-gold wiring adhesion strength can be avoided.

It is preferable that, also in the third gold paste, the particle size of the CuO of the inorganic component ranges from 0.3 μm to 2.0 μm. When the particle size of CuO is less than 0.3 μm, this produces an obstacle to the process of binder burn-out. On the other hand, when the particle size of CuO is greater than 2.0 μm, this results in the drop in the printability of the gold paste and the drop in the ceramic board-to-gold wiring adhesion strength.

The present invention discloses a first ceramic circuit board comprising: (a) a ceramic board and (b) gold wiring formed on the ceramic board, wherein the gold wiring is obtained by subjecting the foregoing first gold paste to a firing process in an atmosphere of nitrogen.

The present invention discloses a second ceramic circuit board comprising: (a) a ceramic board and (b) gold wiring formed on the ceramic board, wherein the gold wiring is obtained by subjecting the foregoing second gold paste to a firing process in an atmosphere of nitrogen.

The present invention discloses a third ceramic circuit board comprising: (a) a ceramic board and (b) gold wiring formed on the ceramic board, wherein the gold wiring is obtained by subjecting the foregoing third gold paste to a firing process in an atmosphere of nitrogen at firing temperatures of 580° C. to 750° C.

Therefore, a ceramic circuit board can be realized in which interconnection between a ceramic board and an electronic component is established by gold wiring, while the other interconnections are established by copper wiring. Additionally, a technique of mounting electronic components such as IC bare chips with the help of a gold bump or gold wire can be used with a soldering technique.

Particularly, in accordance with the third ceramic circuit board, gold wiring can be mounted directly on the copper via conductor, not through the surface-layer copper wiring. Further, direct connection of surface-layer copper wiring to gold wiring can be established, not through a copper/gold overlap section. Therefore, the mounting can be done at a higher density.

It is preferable that the first, second and third ceramic circuit boards each have an electronic component that is electrically connected to the gold wiring. It is preferable that the electronic component is electrically connected by face-down bonding technique to the gold wiring through a joint layer made of an electroconductive adhesive, an anisotropic electroconductivity film/adhesion, or a solder. It is preferable that the first and third ceramic circuit boards each have copper wiring that is directly connected to the gold wiring.

The present invention discloses a method of producing a ceramic circuit board comprising the steps of (a) forming copper wiring on a ceramic board, (b) arranging on the ceramic board an wiring pattern made of the foregoing third gold paste in such a way that the wiring pattern thus formed is connected to the copper wiring, and (c) forming gold wiring by firing the wiring pattern at firing temperatures from 580° C. to 750° C. in an atmosphere of nitrogen.

DETAILED DESCRIPTION OF THE INVENTION

Embodiment 1

Figure 1:
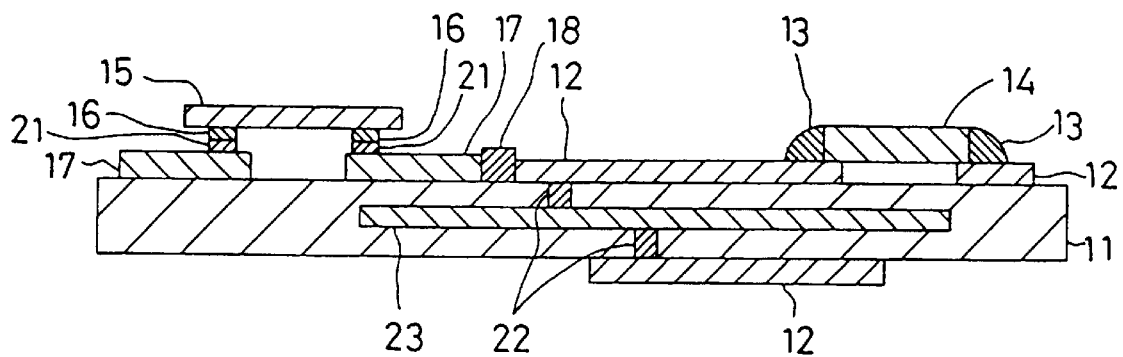
FIG. 1 cross-sectionally shows a ceramic circuit board based on any one of gold pastes of a first to a fourth preferred embodiment of the present invention.

A first preferred embodiment of the invention discloses a first gold paste for use as gold wiring material in the manufacture of ceramic circuit boards. TABLE 1 shows samples of the first gold paste.

Each sample of the first gold paste has a composition comprising (a) powdery gold (Au) and (b) $V_2O_5$. In TABLE 1, the amounts of these gold paste components (i.e., powdery gold and $V_2O_5$) are shown by percent by weight of a respective sample. TABLE 1 further shows the adhesion strength between a ceramic board and gold wiring obtained by firing a respective sample at a firing temperature of 850° C. in a nitrogen atmosphere (the concentration of oxygen: $\leq 10$ ppm).

TABLE 1

| Samples | Au (wt %) | $V_2O_5$ (wt %) | Adhesion Strength (kgf) |
| --- | --- | --- | --- |
| I | 90 | 0.3 | 0.5 |
| II | 90 | 0.5 | 0.8 |
| III | 89 | 1.0 | 1.1 |
| IV | 89 | 1.5 | 1.4 |
| V | 88 | 2.0 | 1.8 |
| VI | 87 | 2.5 | 1.3 |
| ★ | — | — | 0.3 |

Note:
★ = #5723, a product by Du Pont for comparison with the present invention

The adhesion strength of TABLE 1 was determined as follows. In the first place, a wiring pattern of 2 mm×2 mm was screen-printed on a ceramic board surface using the first gold paste. Next, the wiring pattern was fired in an atmosphere of nitrogen (the concentration of oxygen: $\leq 10$ ppm) to form gold wiring. A pin having a diameter of 2 mm was attached to the obtained gold wiring by a soldering paste (indium:lead=1:1). Force was gradually applied to the pin in the direction parallel to the ceramic board surface until the pin had been detached from the ceramic board. The stress at the time of the detachment of the pin (i.e., the maximum stress) was determined. A commercially available gold paste for ceramic circuit boards (e.g., a Du Pont product, #5723) was fired at a firing temperature of 850° C. in an atmosphere of nitrogen (the concentration of oxygen: $\leq 10$ ppm) to form gold wiring, and the adhesion strength of a ceramic board and the obtained gold wiring was determined.

TABLE 1 shows that a content of 0.5 wt % $V_2O_5$ contributes to improvement of the board-to-wiring adhesion strength. The board-to-wiring adhesion strength reaches its maximum value when 2.0 wt % $V_2O_5$ is contained. A content of 2.5 wt % $V_2O_5$ still contributes to improvement of the adhesion strength. If the content of $V_2O_5$ exceeds 2.5 wt %, however, this increases the electric resistance of the obtained gold wiring.

In addition to the powdery gold and the $V_2O_5$, a small amount of glass frit may be added, and the same board-to-wiring adhesion strength is obtainable.

The first gold paste according to the first embodiment is prepared in the following way. In the first place, (a) powdery gold which is the major component of the first gold paste and (b) $V_2O_5$ are dispersed in an organic vehicle to prepare a first gold paste (see TABLE 1 for the composition by wt %). α-terpineol is used as a solvent of the organic vehicle. The organic vehicle is obtained by dissolving an organic binder (i.e., glycidyl methacrylate/isodecyl methacrylate/isobutyl methacrylate copolymer) into α-terpineol.

The amount of the organic binder is preferably 2–5 wt %, and the amount of the solvent is preferably 5–10 wt %. An excess of the organic binder not only increases the resistance of the obtained gold wiring but also reduces the gold wiring-to-ceramic board adhesion strength. If the amount of the organic binder is too small, or if the amount of the solvent is too small or too great, the printability of the gold paste will fall.

The amount of the powdery gold is preferably 82–94 wt %. If the amount of the powdery gold is much below 82 wt %, this will increase the resistance of the obtained gold wiring. If the amount of the powdery gold exceeds a point of 94 wt %, this will reduce the gold paste printability.

Although the present embodiment uses α-terpineol as a solvent of the organic vehicle, any other type of solvent may be useful as long as it will neither cause storage/printing problems nor produce an obstacle to a binder burn-out/firing process.

The present embodiment uses a glycidyl methacrylate/isodecyl methacrylate/isobutyl methacrylate copolymer as an organic binder. However, any organic binder capable of decomposing and vaporing in an atmosphere of nitrogen (e.g., poly methyl methacrylate) may be useful.

Resins such as ethyl cellulose, although not vaporizable in an atmosphere of nitrogen, may serve as an organic binder if they are present in an amount within 1.0 wt %. Use of the glycidyl methacrylate/isodecyl methacrylate/isobutyl methacrylate copolymer as an organic binder finds applications in various offset printing methods (for example, the gravure offset printing) in which a gold paste is transferred onto a board through a silicon rubber. This offset printing can produce finer patterns compared with the screen printing.

It is preferable that the powdery gold of the inorganic component has a particle size of 0.3 to 1.5 $\mu$m. If the particle size of the powdery gold is much smaller than 0.3 $\mu$m, the process of binder burn-out cannot be carried out sufficiently in a nitrogen atmosphere. Conversely, if the particle size is much greater than 2.0 $\mu$m, this not only reduces the gold paste printability but also prevents the production of closely composed gold wiring. If the variation in the particle size of the powdery gold is held not greater than 0.5 $\mu$m, then much closely composed gold wiring can be obtained.

It is preferable that the $V_2O_5$ of the inorganic component has a particle size of 0.3 to 2.0 $\mu$gm. It is preferable that the glass frit of the inorganic component has a particle size of 0.3 to 2.0 $\mu$m. If the particle size of the $V_2O_5$ or the glass frit is much smaller than 0.3 $\mu$m, this reduces the gold paste printability. If the particle size of the $V_2O_5$ or the glass frit is much greater than 2.0 $\mu$m, this reduces the gold paste-to-board adhesion strength.

How to make the ceramic circuit board as shown in FIG. 1 is described. Elements of the ceramic circuit board of FIG. 1 will not be described here since they have already been described previously.

The ceramic board 11 is provided with the surface-layer copper wiring 12, the copper via conductor 22, and the inner-layer copper wiring 23. A gold paste (for example, Sample I of TABLE 1) is transferred by a screen printing method onto an electrode of the ceramic board 11 where the IC bare chip 15 is mounted at a later step. This is followed by a drying process to dry the gold paste transferred. Then, the ceramic board 11 is placed in a belt furnace so as to subject the gold paste to a binder burn-out process and a firing process in an atmosphere of nitrogen (the concentration of oxygen:≦10 ppm) at a firing temperature of 850° C. As a result, the gold wiring 17 and the copper/gold overlap layer 18 are formed. The surface-layer copper wiring 12 is formed by subjecting a commercially available copper paste for ceramic circuit boards (e.g., QP153 by Du Pont) to a firing process in an atmosphere of nitrogen (the concentration of oxygen:≦10 ppm) at a firing temperature of 900° C. The copper via conductor 22 and the inner-layer copper wiring 23 are formed as follows. Firstly, a copper (II) oxide (CuO) paste for ceramic circuit boards is subjected to a binder burn-out process at a temperature of 400° C. in the air. The CuO paste is then reduced to copper at a temperature of 250° C. in an atmosphere of hydrogen and is fired at a firing temperature of 900° C. in an atmosphere of nitrogen (the concentration of oxygen:≦10 ppm). In this way, the copper via conductor 22 and the inner-layer copper wiring 23 are formed.

Next, the IC bare chip 15 carrying thereon the gold bump 16 is face-down bonded onto the gold wiring 17 through the joint layer 21, and the chip component 14 is mounted on the surface-layer copper wring 12 through the solder layer 13. The joint layer 21 may be an electroconductive adhesive, an anisotropic electroconductivity film/adhesive, a solder, or the similar material.

The operation of mounting the IC bare chip 15 onto the gold wiring 17 made of Sample VI of TABLE 1 was carried out smoothly, and the reliability of the gold wiring 17 proved to be acceptable. The firing process, carried out to Sample VI of TABLE 1, had neither reduced the solderability of the surface-layer copper wiring 12 nor increased the resistances of the surface-layer copper wiring 12, the copper via conductor 22, and the inner-layer copper wiring 23. Therefore, the operation of mounting the chip component 14 onto the surface-layer copper wiring 12 through the solder layer 13 was carried out smoothly, and the reliability of the solder layer 13 proved to be acceptable.

In the present embodiment, the IC bare chip 15 is mounted onto the gold wiring 17 through the gold bump 16. The IC bare chip 15 may be connected by a gold wire to the gold wiring 17.

Embodiment 2

A second preferred embodiment of the invention discloses a second gold paste for use as gold wiring material in the manufacture of ceramic circuit boards. TABLE 2 shows samples of the second gold paste.

Each sample of the second gold paste has a composition comprising (a) powdery gold (Au) and (b) glass frit having a content of $V_2O_5$. In TABLE 2, the amounts of these gold paste components (i.e., powdery gold and glass frit) are shown by percent by weight of a respective first gold paste sample and the amount of the $V_2O_5$ is shown by percent by weight of the glass frit. TABLE 2 further shows the adhesion strength between a ceramic board and gold wiring obtained by firing a respective sample at a firing temperature of 850° C. in a nitrogen atmosphere (the concentration of oxygen:≦10 ppm).

TABLE 2

| Sample | Au (wt %) | Glass Frit (wt %) $V_2O_5$ (in parentheses) | Adhesion Strength (kgf) |
| --- | --- | --- | --- |
| I | 88 | 2.0 (0) | 0.4 |
| II | 88 | 2.0 (1.0) | 0.5 |
| III | 88 | 2.0 (2.0) | 0.9 |
| IV | 88 | 2.0 (4.0) | 1.1 |
| V | 88 | 2.0 (6.0) | 1.2 |
| VI | 88 | 2.0 (10.0) | 1.7 |
| VII | 88 | 2.0 (15.0) | 1.5 |
| VIII | 88 | 2.0 (20.0) | 1.0 |
| IX | 88 | 1.5 (10.0) | 1.7 |
| X | 89 | 1.0 (10.0) | 1.4 |
| XI | 90 | 0.5 (10.0) | 0.9 |
| XII | 90 | 0.3 (10.0) | 0.7 |

The second gold paste according to the second embodiment is prepared in the following way. In the first place, (a) powdery gold which is the major component of the first gold paste and (b) glass frit having a content of $V_2O_5$ are dispersed in the organic vehicle of the first embodiment to prepare a second gold paste (see TABLE 2 for the composition by wt %).

Even if the amount of the $V_2O_5$ of the glass frit by percent by weight of the second gold paste is made smaller than that of the first gold paste, the same gold wiring-to-ceramic board adhesion strength as obtained by the first embodiment can be obtained.

It is preferable that the $V_2O_5$ of the glass frit is present in an amount within the range of 2.0 to 20 percent by weight of the glass frit. Much deviation from this range results in the drop in gold wiring-to-ceramic board adhesion strength.

It is preferable that the glass frit is present in an amount within the range of 0.3 to 3.0 percent by weight of the gold paste. If the glass frit content is much below 0.3 percent by weight of the gold paste, this results in the drop in gold wiring-to-ceramic board adhesion strength. If the glass frit content exceeds 3.0 percent by weight of the gold paste, this increases the resistance of the obtained gold wiring.

In the second gold paste and the first gold paste, the same types of powdery gold, organic binder, and solvent are used.

In the second gold paste and the first gold paste, powdery gold, organic binder, and solvent are present in the same preferred amounts.

The ceramic circuit board of FIG. 1 can be produced using the second gold paste.

Embodiments 3 and 4

A third preferred embodiment of the invention discloses a third gold paste for use as gold wiring material in the manufacture of ceramic circuit boards. TABLE 3 shows samples of the third gold paste.

Each sample of the third gold paste has a composition comprising (a) powdery gold (Au), (b) $V_2O_5$, and (c) copper (II) oxide (CuO). In TABLE 3, the amounts of these gold paste components (i.e., powdery gold, $V_2O_5$, and CuO) are shown by percent by weight of a respective sample. TABLE 3 further shows the adhesion strength between a ceramic board and gold wiring obtained by firing a respective sample at a firing temperature of 850° C. in a nitrogen atmosphere (the concentration of oxygen: ≦10 ppm).

TABLE 3

| Samples | Au (wt %) | $V_2O_5$ (wt %) | CuO (wt %) | Adhesion Strength (kgf) |
|---------|-----------|-----------------|------------|-------------------------|
| I       | 89        | 0.3             | 1.0        | 1.8                     |
| II      | 89        | 0.5             | 1.0        | 2.6                     |
| III     | 88        | 1.0             | 1.0        | 2.7                     |
| IV      | 87        | 1.5             | 1.0        | 2.7                     |
| V       | 89        | 2.0             | 0.1        | 1.8                     |
| VI      | 88        | 2.0             | 0.3        | 2.0                     |
| VII     | 87        | 2.0             | 0.7        | 2.5                     |
| VIII    | 87        | 2.0             | 1.0        | 2.9                     |
| IX      | 88        | 2.0             | 1.5        | 2.8                     |
| X       | 88        | 2.0             | 2.0        | 2.3                     |

A fourth preferred embodiment of the invention discloses a fourth gold paste for use as gold wiring material in the manufacture of ceramic circuit boards. TABLE 4 shows samples of the fourth gold paste.

Each sample of the fourth gold paste has a composition comprising (a) powdery gold, (b) glass frit having a content of $V_2O_5$, and (c) CuO. In TABLE 4, the amounts of these gold paste components (i.e., powdery gold, glass frit, and CuO) are shown by percent by weight of a respective fourth gold paste sample and the amount of the $V_2O_5$ is shown by percent by weight of the glass frit. TABLE 4 further shows the adhesion strength between a ceramic board and gold wiring obtained by firing a respective paste sample at a firing temperature of 850° C. in a nitrogen atmosphere (the concentration of oxygen: ≦10 ppm).

TABLE 4

| Samples | Au (wt %) | Glass Frit (wt %) $V_2O_5$ (in parentheses) | CuO (wt %) | Strength (kgf) |
|---------|-----------|---------------------------------------------|------------|----------------|
| I       | 87        | 2.0 (4.0)                                   | 1.0        | 1.2            |
| II      | 87        | 2.0 (6.0)                                   | 1.0        | 1.8            |
| III     | 89        | 2.0 (10.0)                                  | 0.1        | 1.7            |
| IV      | 85        | 2.0 (10.0)                                  | 0.3        | 2.0            |
| V       | 84        | 2.0 (10.0)                                  | 0.7        | 2.1            |
| VI      | 84        | 2.0 (10.0)                                  | 1.0        | 2.2            |
| VII     | 83        | 2.0 (10.0)                                  | 1.5        | 2.0            |
| VIII    | 83        | 2.0 (10.0)                                  | 2.0        | 2.3            |
| IX      | 84        | 2.0 (15.0)                                  | 1.0        | 2.1            |
| X       | 84        | 1.5 (10.0)                                  | 1.0        | 2.5            |
| XI      | 85        | 1.0 (10.0)                                  | 1.0        | 2.3            |

Whereas the third gold paste is prepared by dispersing an inorganic component, formed by adding CuO to the inorganic component of the first gold paste, into an organic vehicle, the fourth gold paste is prepared by dispersing an inorganic component, formed by adding CuO to the inorganic component of the second gold paste, into an organic vehicle.

The examination showed that the addition of CuO improved the gold wiring-to-ceramic board adhesion strength to a further extent (see TABLES 3 and 4).

It is preferable that CuO is present in an amount within the range of 0.3 to 2.0 wt %. As shown in TABLES 3 and 4, when an amount greater than 0.3 percent by weight of CuO is added, this further improves the adhesion strength. If an amount greater than 2.0 percent by weight of CuO is added, then the resistance of the obtained gold wiring increases.

It is preferable that, in the third and fourth gold pastes, CuO being added is spherical having a particle size of about 0.3 to 2.0 µm. If the particle size of CuO being added is much smaller than 0.3 µm, this becomes an obstacle to the process of binder burn-out. On the other hand, if CuO has a particle size much greater than 2.0 µm, this not only decreases the gold paste printability but also weakens the gold wiring-to-ceramic board adhesion strength.

In the third and fourth gold pastes, the same types of powdery gold, $V_2O_5$, glass frit, organic binder, and solvent as used in the first gold paste are employed.

In the third and fourth gold pastes, the preferable amounts of gold paste components such as powdery gold, $V_2O_5$, glass frit, organic binder and solvent are the same as in the first gold paste.

The ceramic circuit board of FIG. 1 can be produced by using the third gold paste or the fourth gold paste.

Embodiment 5

A fifth preferred embodiment of the invention discloses a fifth gold paste for use as gold wiring material in the manufacture of ceramic circuit boards. TABLE 5 shows samples of the fifth gold paste.

Each sample of the fifth gold paste has a composition comprising (a) powdery gold (Au) having an average particle size of 0.6 µm, (b) $V_2O_5$, and (c) copper (II) oxide (CuO). In TABLE 5, the amounts of these gold paste components (i.e., powdery gold, $V_2O_5$, and CuO) are shown by percent by weight of a respective sample. TABLE 4 further shows the adhesion strength between a ceramic board and gold wiring obtained by firing a respective sample at different firing temperatures (i.e., 580° C., 700° C., and 750° C.) in a nitrogen atmosphere (the concentration of oxygen:≦10 ppm).

TABLE 5

| Samples | Au (wt %) | V$_2$O$_5$ (wt %) | CuO (wt %) | Strength (kgf/2 mm□) 580° C. | 700° C. | 750° C. |
|---|---|---|---|---|---|---|
| I | 89 | 0.3 | 1.0 | 1.5 | 1.7 | 1.7 |
| II | 89 | 0.3 | 1.5 | 1.4 | 1.6 | 1.7 |
| III | 90 | 0.6 | 0.3 | 1.4 | 1.5 | 1.5 |
| IV | 89 | 0.6 | 0.5 | 1.8 | 2.0 | 2.0 |
| V | 89 | 0.6 | 1.0 | 2.0 | 2.5 | 2.5 |
| VI | 88 | 0.6 | 1.5 | 1.6 | 1.8 | 1.9 |
| VII | 89 | 1.0 | 0.5 | 1.9 | 2.1 | 2.1 |
| VIII | 88 | 1.0 | 1.0 | 1.9 | 2.0 | 2.2 |
| IX | 88 | 2.0 | 0.5 | 1.6 | 1.6 | 1.6 |

The fifth gold paste is prepared by dispersing a composition comprising (a) powdery gold having an average particle size within the range of 0.3 to 0.7 μm, (b) powdery V$_2$O$_5$, and (c) powdery CuO into an organic binder.

The fifth gold paste thus prepared is capable of being subjected to a firing process at temperatures ranging from 580 to 750° C. in an atmosphere of nitrogen.

This makes it possible to perform a binder burn-out process and thereafter to sinter the powdery gold so that the ceramic board 11 and the gold wiring 17 can be joined together by the V$_2$O$_5$ and CuO of the gold paste.

The samples of the fifth gold paste of TABLE 5 each use powdery gold having an average particle size of 0.6 μm. However, different powdery gold having an average particle size within the rage of 0.3 to 0.7 μm may be used to obtain the same effect. If the average particle size gets smaller than 0.3 μm, this produces an obstacle to binder burn-out from the gold paste. If the average particle size gets greater than 0.7 μm, this results in the powdery gold being sintered insufficiently. If the particle size of the powdery gold greatly varies, this also produces an obstacle to binder removal.

In the fifth gold paste, the same types of V$_2$O$_5$, CuO, organic binder, and solvent as used in the first gold paste are employed.

Figure 2:
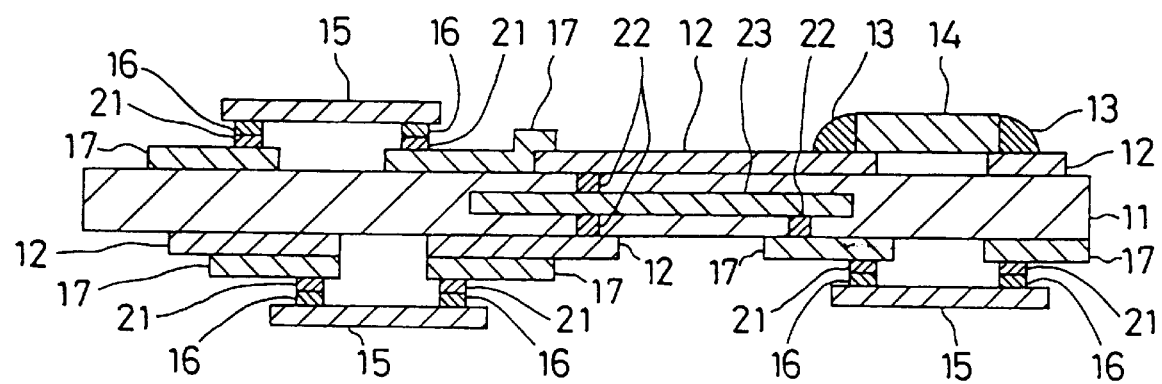
FIG. 2 cross-sectionally shows a ceramic circuit board based on a gold paste of a fifth preferred embodiment of the present invention.
Figure 3:
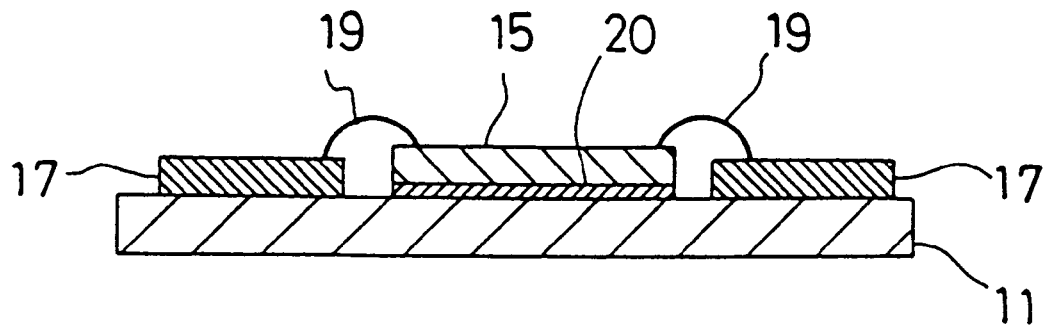
FIG. 3 cross-sectionally shows a ceramic circuit board based on a conventional gold paste.
Figure 4:
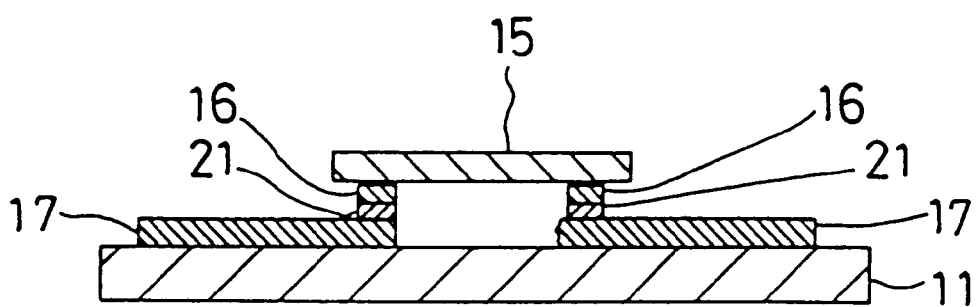
FIG. 4 cross-sectionally shows another ceramic circuit board based on a conventional gold paste.

In the present embodiment, the firing temperature ranges from 580 to 750° C. so that an improved ceramic circuit board like one as shown in FIG. 2 can be produced which has a higher-density mounting capability as compared to one as shown in FIG. 1.

FIG. 2 cross-sectionally shows a ceramic circuit board based on the fifth gold paste. FIG. 2 shows the ceramic board 11, the surface-layer copper wiring 12, the solder layer 13, the chip component 14, the IC bare chip 15, the gold bump 16, the gold wiring 17, the joint layer 21, and the via-hole copper 22, and the inner-layer copper wiring 23.

A conventional gold paste for use as gold wiring material was examined by transferring it (the conventional gold paste) onto the copper via conductor 22 and then firing the paste transferred. The examination showed that disconnection between the copper via conductor 22 and the gold wiring 17 had occurred. Good ceramic circuit boards were not obtainable.

In the fifth embodiment, however, the firing temperature is set at 580–750° C. so that the copper via conductor 22 and the gold wiring 17 can be interconnected directly. Such a direct interconnection allows the gold wiring 17 to be formed on the copper via conductor 22, not through the surface-layer copper wiring 12 (see FIG. 2). This enables the production of higher-density ceramic circuit boards.

Additionally, by setting the firing temperature at 580–750° C., the gold wiring 17 can be formed on the surface-layer copper wiring 12 and the IC bare chip 15 carrying thereon the gold bump 16 can be mounted onto the gold wiring 17. As shown in FIG. 2, the surface-layer copper wiring 12 and the gold wiring 17 can be interconnected, not through the copper/gold overlap layer 18. This also enables the production of higher-density ceramic circuit boards.

A method of making the ceramic circuit board of FIG. 2 based on the fifth gold paste is now described.

The ceramic board 11 is provided with the surface-layer copper wiring 12, the copper via conductor 22, and the inner-layer copper wiring 23. One of the samples of the fifth gold paste (for example, Sample V of TABLE 5) is transferred by a screen printing technique onto an electrode of the ceramic board 11 where the IC bare chip 15 is being mounted. This is followed by a drying process to dry the gold paste thus transferred. Then, in order to form the gold wiring 17, the ceramic board 11 is placed in a belt furnace so as to subject the gold paste to binder burn-out process and firing process in a nitrogen atmosphere (the concentration of oxygen:≦10 ppm) at a firing temperature of 600° C.

The surface-layer copper wiring 12 is formed by subjecting a commercially available copper paste for ceramic circuit boards (e.g., QP153, a product by Du Pont) to a firing process in a nitrogen atmosphere (the concentration of oxygen:≦10 ppm) at a firing temperature of 900° C. The copper via conductor 22 and the inner-surface copper wiring 23 are formed as follows. Firstly, a CuO paste for ceramic circuit boards is subjected to a binder burn-out process at a temperature of 400° C. in the air. The CuO paste is then reduced to copper at a temperature of 250° C. in a hydrogen atmosphere of hydrogen and thereafter is fired at a firing temperature of 900° C. in a nitrogen atmosphere (the concentration of oxygen:≦10 ppm).

Next, the IC bare chip 15 on which the gold bump 16 has been formed is face-down mounted onto the gold wiring 17 through the joint layer 21, and the chip component 14 is mounted on the surface-layer copper 12 through the solder layer 13. The IC bare chip 15 was actually mounted onto the gold wiring 17 made from Sample V of TABLE 5, and such mounting was carried out smoothly. The reliability of the gold wiring 17 was found to be good.

The firing of Sample V of TABLE 5 had neither reduced the solderability of the surface-layer copper wiring 12 nor increased the resistances of the surface-layer copper wiring 12, the copper via conductor 22, and the inner-layer copper wiring 23. The chip component 14 was mounted onto the surface-layer copper wiring 12 through the solder layer 13, and such mounting was carried out smoothly. The reliability of the solder layer 13 was found to be good.

It was proved that the gold wiring 17 had become more reliable by carrying out the process of binder burn-out at temperatures of 400–550° C. to remove a binder from the gold paste.

In the ceramic circuit board of FIG. 2, the IC bare chip 15 is mounted on the gold wiring 17 through the gold bump 16. The IC bare chip 15 may be connected by a gold wire to the gold wiring 17.

In the ceramic circuit board of FIG. 2, the IC bare chip 15 carrying thereon the gold bump 16 is mounted on the gold wiring 17. Instead, other electronic components may be mounted onto the gold wiring 17 through the joint layer 21.

What is claimed is:

1. A method of producing a ceramic circuit board comprising the steps of:

(i) forming copper wiring on a ceramic board,
   (ii) arranging on said ceramic board a wiring pattern formed by a gold paste for a ceramic circuit board in such a way that said wiring pattern is connected to said copper wiring, wherein said gold paste has a composition comprising:

(a) an inorganic component:
   (b) an organic binder, and
   (c) a solvent, where said inorganic component contains powdered gold with average particle size of 0.3 to 0.7 m, $V_2O_5$, and copper (II) oxide, said powdered gold being present in an amount within the range of 82 to 94 percent by weight of said gold paste, said $V_2O_5$ being present in an amount within the range of 0.3 to 2.0 percent by weight of said gold paste, said CuO being present in an amount within the range of 0.3 to 2.0 percent by weight of said gold paste, and, (iii) forming gold wiring by firing said wiring pattern at firing temperatures from 580° C. to 750° C. in an atmosphere of nitrogen.

* * * * *